(12) United States Patent
Carlson et al.

(10) Patent No.: US 6,784,361 B2
(45) Date of Patent: Aug. 31, 2004

(54) AMORPHOUS SILICON PHOTOVOLTAIC DEVICES

(75) Inventors: David E. Carlson, Williamsburg, VA (US); Guang H. Lin, Ellicott City, MD (US); Gautam Ganguly, Williamsburg, VA (US)

(73) Assignee: BP Corporation North America Inc., Warrenville, IL (US)

( * ) Notice: Subject to any disclaimer, the term of this patent is extended or adjusted under 35 U.S.C. 154(b) by 0 days.

(21) Appl. No.: 09/957,353

(22) Filed: Sep. 20, 2001

(65) Prior Publication Data

US 2002/0046766 A1 Apr. 25, 2002

Related U.S. Application Data

(60) Provisional application No. 60/234,094, filed on Sep. 20, 2000.

(51) Int. Cl.[7] .................. H01L 31/024; H01L 31/0312; H01L 31/0376
(52) U.S. Cl. ...................... 136/258; 136/251; 136/259; 136/261; 52/173.3
(58) Field of Search ................................. 136/244, 249, 136/251, 258, 259, 261; 52/173.3

(56) References Cited

U.S. PATENT DOCUMENTS

| | | | | |
|---|---|---|---|---|
| 4,410,559 A | * | 10/1983 | Hamakawa et al. | 438/485 |
| 4,453,173 A | * | 6/1984 | Carlson et al. | 257/53 |
| 5,071,490 A | * | 12/1991 | Yokota et al. | 136/249 |
| 5,990,414 A | * | 11/1999 | Posnansky | 136/244 |
| 6,300,555 B1 | * | 10/2001 | Kondo et al. | 136/244 |
| 6,525,264 B2 | * | 2/2003 | Ouchida et al. | 136/246 |
| 2001/0008143 A1 | * | 7/2001 | Sasaoka et al. | 136/244 |

* cited by examiner

Primary Examiner—Nam Nguyen
Assistant Examiner—Brian L. Mutschler
(74) Attorney, Agent, or Firm—Thomas E. Nemo

(57) ABSTRACT

This invention is a photovoltaic device comprising an intrinsic or i-layer of amorphous silicon and where the photovoltaic device is more efficient at converting light energy to electric energy at high operating temperatures than at low operating temperatures. The photovoltaic devices of this invention are suitable for use in high temperature operating environments.

14 Claims, 4 Drawing Sheets

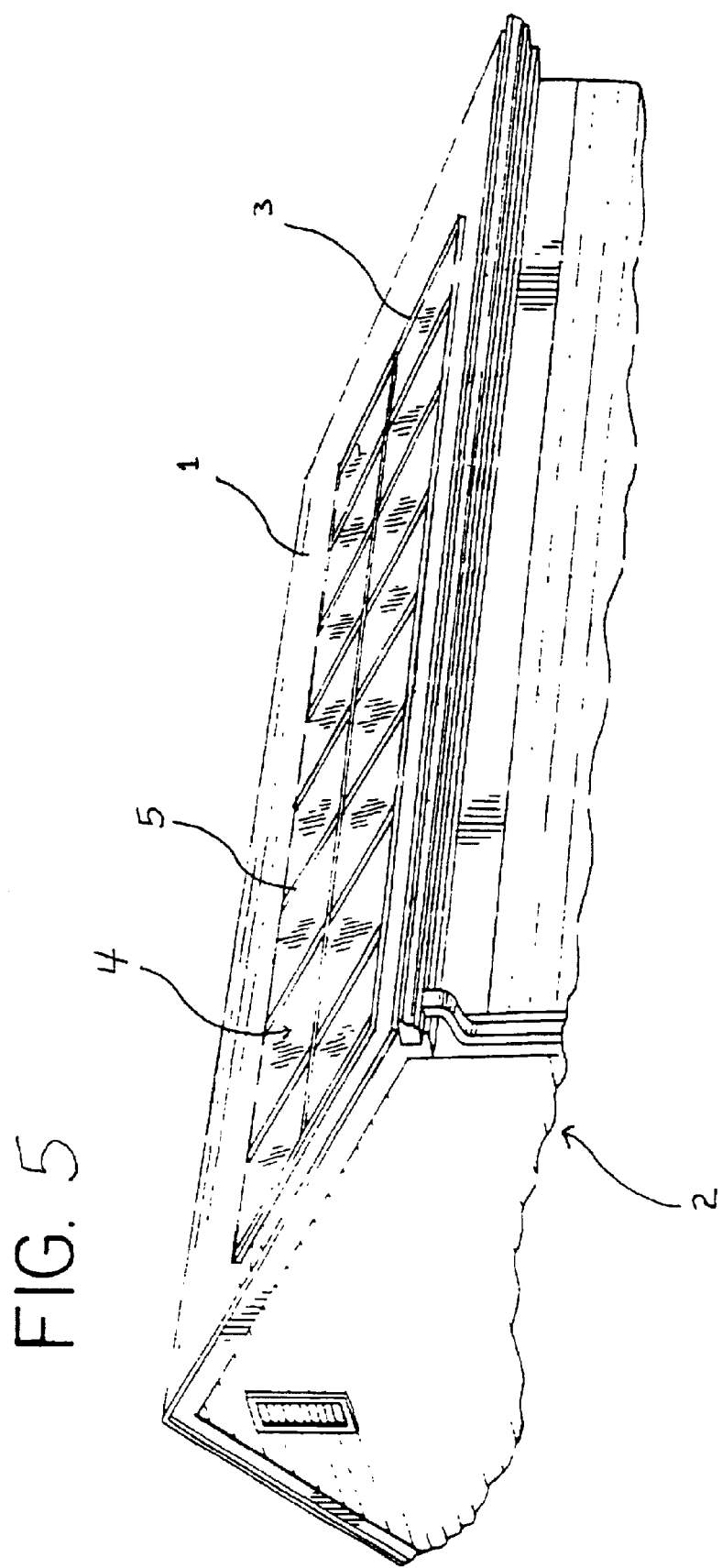

AMORPHOUS SILICON PHOTOVOLTAIC DEVICES

This application claims the benefit of U.S. Provisional Application No. 60/234,094 filed Sep. 20, 2000.

This invention was made with Government support under NREL Subcontract No. ZAK-8-17619-02; Prime Contract No. DE-AC36-83CHI10093 awarded by the Department of Energy. The Government has certain rights in this invention.

BACKGROUND OF THE INVENTION

This invention pertains to photovoltaic devices, particularly, to solar cells comprising amorphous silicon. More particularly, this invention relates to photovoltaic devices comprising amorphous silicon wherein the amorphous silicon in the form of an intrinsic layer or i-layer is thick, and wherein the photovoltaic devices having such thick i-layers perform unexpectedly well at elevated temperatures.

Solar cells and other photovoltaic devices convert solar radiation and other light into usable electrical energy. The energy conversion occurs as the result of the photovoltaic effect. Solar radiation (sunlight) impinging on a photovoltaic device and absorbed by an active region of semi-conductor material, e.g. an intrinsic i-layer of amorphous silicon, generates electron-hole pairs in the active region. The electrons and holes are separated by an electric field of a junction in the photovoltaic device. The separation of the electrons and holes by the junction results in the generation of an electric current and voltage. The electrons flow toward the region of the semiconductor material having an n-type conductivity. The holes flow toward the region of the semiconductor material having a p-type conductivity. Current will flow through an external circuit connecting the n-type region to the p-type region as long as light continues to generate electron-hole pairs in the photovoltaic device.

Single-junction photovoltaic devices comprise three layers. These are p- and n-layers which are extrinsic or doped and the i-layer which is intrinsic or undoped (at least containing no intentional doping). The i-layer is thicker than the doped layers. This is because mainly light absorbed in the i-layer is converted to electrical power which can be used in an external circuit. As discussed above, when a photon of light is absorbed in the i-layer it gives rise to a unit of electrical current (an electron-hole pair). However, this electrical current will go nowhere on its own. Hence, the p- and n-layers. These layers, which contain charged dopant ions, set up a strong electric field across the i-layer. It is this electric field, which "draws" the electric charge out of the i-layer and sends it through an external circuit where it can provide power for electrical components.

Thin film solar cells, which are one type of solar cells, are typically constructed of amorphous silicon-containing semiconductor films on a substrate. The substrate of the solar cell can be made of glass or a metal, such as aluminum, niobium, titanium, chromium, iron, bismuth, antimony or steel. Soda-lime glass is often used as a substrate because it is inexpensive, durable and transparent. If a glass substrate is used, a transparent conductive coating, such as tin oxide ($SnO_2$) can be applied to the glass substrate prior to forming the amorphous silicon-containing semiconductor films. A metallic contact can be formed on the back of the solar cell. Solar cells are often placed in metal frames to provide attractive photovoltaic modules.

In an amorphous silicon-containing solar cell, the amorphous silicon component is comprised of a body of hydrogenated amorphous silicon (a-Si:H) material. This can be formed in a glow discharge of silane ($SiH_4$). Such cells can be of the type described in U.S. Pat. No. 4,064,521 entitled Semiconductor Device Having A Body Of Amorphous Silicon, which issued to David E. Carlson on Dec. 20, 1977.

The process of glow discharge of silane and other suitable materials involves the discharge of energy through a gas at relatively low pressure and high temperature in a partially evacuated chamber. A typical process for fabricating an amorphous silicon solar cell comprises placing a substrate on a heated element within a vacuum chamber. A screen electrode, or grid, is connected to one terminal of a power supply, and a second electrode is connected to the substrate. While silane, at low pressure, is admitted into the vacuum chamber, a glow discharge is established between the two electrodes and an amorphous silicon film deposits upon the substrate.

Amorphous hydrogenated silicon (a Si:H) based solar cell technology is a good candidate for large area, low-cost photovoltaic applications. The basic device structure is a single p-i-n junction or an n-i-p junction in which all layers are traditionally amorphous and are made in a continuous plasma deposition process as described above. The collection of layers resulting in a p-i-n or n-i-p component, are referred to herein, at times, as a cell.

Current output of a photovoltaic device is maximized by increasing the total number of photons of differing energy and wavelength, which are absorbed by the semiconductor material. The solar spectrum roughly spans the region of wavelength from about 300 nanometers to about 2200 nanometers, which corresponds to from about 4.2 eV to about 0.59 eV, respectively. The portion of the solar spectrum, which is absorbed by the photovoltaic device is determined by the size of the bandgap energy of the semiconductor material. Solar radiation (sunlight) having an energy less than the bandgap energy is not absorbed by the semiconductor material and, therefore, does not contribute to the generation of electricity, current, voltage and power, of the photovoltaic device.

The doped layers in the device play a key role in building up the strong internal electric field across the i-layer, which is the predominant force in collecting photocarriers generated in the i-layer. An important quality for the doped layers used in solar cells, besides good electrical properties, is low optical absorption. In contrast to single crystalline devices where p-n junctions can be used, photons absorbed in amorphous doped layers can be lost because the diffusion length of photo-carriers is extremely short in those layers. This requirement is especially important for the p-layer through which light enters into the device. It is partly for this reason that amorphous silicon carbon (a-SiC:H) p-layers with an optical bandgap of about 2.0 eV have been used instead of amorphous silicon.

On of the most important objectives in designing and manufacturing a photovoltaic device such as a solar cell is to maximize the efficiency of the device in converting light energy into electric energy. It would be desirable in some applications to use the photovoltaic device in a climate, or under other conditions, as on a roof top with poor or no air circulation around the device. Under such conditions, the photovoltaic device may reach elevated temperatures of, for example, more than 50° C., or more than 60° C. It would be advantageous to have a photovoltaic device that operates efficiently at these elevated temperatures and, more particularly, it would be highly advantageous to have an amorphous silicon-type photovoltaic device, which operates more efficiently at these high temperatures compared to prior devices. The present invention provides for such photovoltaic devices and a process for using them to generate electricity.

SUMMARY OF THE INVENTION

This invention is a photovoltaic device comprising an amorphous silicon-containing i-layer that is efficient at elevated operation temperatures. This invention is a photovoltaic device comprising an amorphous, silicon-containing i-layer wherein the i-layer has a thickness of at least about 3000 Å, more preferably at least about 3500 Å. Preferably the i-layer has a thickness of about 3000 to about 5500 Å, more preferably about 3500 to about 5000 Å. It can have a thickness of about 4000 to about 5000 Å, or from greater than 4000 Å and, suitably, up to about 5000 or 6000 Å. The i-layer can be at least about 5000 Å, at least about 5500 Å, and can be at least about 6000 Å. We have determined that photovoltaic devices having such thick i-layers function much more efficiently at elevated operation temperatures, for example, temperatures of at least about 50° C., than prior photovoltaic devices having thinner amorphous i-layers. The photovoltaic devices of this invention preferably have a p-layer of less than 150 Å, more preferably no more than about 100 Å and most preferably no more than about 80 Å in thickness. P-layers of about 60 to about 80 Å, or about 70 to about 80 Å in thickness are also highly preferred. We have determined that these relatively thin p-layers are more preferable for operation at high temperatures, especially at the higher temperatures mentioned above. This invention is also a process for generating electric current comprising exposing photovoltaic devices to light, particularly solar radiation, wherein the photovoltaic device is operated at elevated temperatures, for example temperatures of at least about 50° C., more preferably temperatures of at least about 55° C., and most preferably at temperatures of at least about 60° C. wherein the photovoltaic device comprises an amorphous, silicon-containing i-layer having a thickness of at least about 3000 Å, more preferably at least about 3500 Å. The upper temperature limit can be 90° C. or even 100° C., or higher. Preferably the i-layer has a thickness of about 3000 to about 5500 Å, more preferably about 3500 to about 5000 Å. In the process of this invention the p-layers the photovoltaic devices preferably have a p-layer of less than 150 Å, more preferably no more than about 100 Å and most preferably no more than about 80 Å in thickness. P-layers of about 60 to about 80 Å in thickness, or about 70 to about 80 Å in thickness are also highly preferred in the photoelectric devices in the process of this invention.

In the preferred photovoltaic device of this invention, a single or dual layer front contact is positioned on a substrate and at least one amorphous silicon-containing thin film semiconductor is deposited on the front contact. The substrate can be stainless steel or other metal, but preferably comprises a glass substrate. Advantageously, a dual layer back (rear) contact is deposited on the thin film semiconductor. One of the layers of each of the contacts can comprise a wide band gap semiconductor, preferably a transparent metallic conductive oxide, such as tin oxide, indium-tin oxide, zinc oxide, or cadmium stannate. Desirably, the other layer of the dual layer back contact comprises a metal, such as: aluminum, silver, molybdenum, platinum, steel, iron, niobium, titanium, chromium, bismuth, antimony, or oxides of the preceding. The front contact can also have a second layer comprising a dielectric on a glass substrate, such as silicon dioxide.

The thin film semiconductor preferably comprises an amorphous silicon-containing material, such as: hydrogenated amorphous silicon, hydrogenated amorphous silicon carbon, or hydrogenated amorphous silicon germanium. Most preferably it is amorphous silicon. The photovoltaic modules preferably comprise monolithic solar cells, such as: single junction solar cells, multi-junction solar cells, dual junction (tandem) solar cells or triple junction solar cells. If desired, a portion of the photovoltaic module can be microcrystalline or polycrystalline. Most preferably, the thin film semiconductor comprises a single junction solar cell.

A conductive paste, such as a fritted conductive paste, can be deposited on the substrate and then heated and bonded to the substrate to provide a means of collecting current and to allow a solderable external connection.

In the preferred process for making the photovoltaic devices of this invention, the transparent conductive oxide of the front contact is laser scribed in a pattern of parallel-spaced scribes, and the semiconductor layers are deposited on the front contact by enhanced plasma chemical vapor deposition. Thereafter, the transparent conductive oxide first layer of the dual layer rear contact is deposited on the rear (back) layer of the semiconductor. Advantageously, the semiconductor layers and the transparent conductive oxide (but not the conductive oxide of the front contact) first layer of the dual layer rear contact are simultaneously laser scribed in a pattern parallel to the front pattern on the front contact and a trench is formed. Subsequently, a metallic second layer on the rear contact is deposited on the transparent conductive oxide first layer of the rear contact. Desirably, the metal of the second layer fills the trench and provides a superb mechanical and electrical interconnect (interconnection) between the front contact and the metallic second layer of the rear contact. The metallic second layer of the rear contact is then laser scribed in a pattern parallel to the pattern on the semiconductor and first layer of the rear contact to isolate the segments of the photovoltaic module and provide series interconnects for the dual layers of the rear contact. A perimeter can then be laser scribed around the photovoltaic module to completely isolate the segments of the photovoltaic module from each other, except through the interconnects. The photovoltaic module can then be cured by generating a direct current across adjacent segments in a reverse bias orientation to remove shunts and shorts and decrease parasitic losses.

An encapsulating material, such as ethyl vinyl acetate (EVA) and/or Tedlar type plastic can be deposited on the back second layer of the rear contact, and a superstrate can be laminated to the photovoltaic module to provide enhanced environmental protection for the photovoltaic module.

In the preferred form, the superstrate, if any, and substrate are glass, the transparent conductive oxide of the front contact is tin oxide, the transparent conductive oxide first layer of the rear contact is zinc oxide and the metallic second layer of the rear contact and the interconnect is aluminum. The semiconductor preferably comprises a single junction cell comprising an amorphous silicon p-i-n or n-i-p cell. However, this invention is not so limited and the semiconductor can comprise other semiconductors such as a dual junction cell wherein the semiconductor comprises, for example, an amorphous silicon p-i-n or n-i-p cell and a silicon germanium p-i-n or n-i-p cell.

The inventive monolithic solar cells are able to capture a broader spectrum of sun light and convert and harness a greater amount of solar energy into electricity at elevated temperatures compared to prior cells. Advantageously, the monolithic solar cells and process for their production are efficient, effective, reliable, and economical. As used in this application, the term "monolithic" means a solar cell comprising a front contact and a rear-contact. The segments, layers, or cells of a monolithic solar cell are electrically and optically connected to each other to form one solar cell or photovoltaic module.

The transparent conductive oxide, such as zinc oxide or tin oxide, can be deposited by low-pressure chemical vapor deposition (LP CVD). The layer of doped and undoped amorphous silicon and microcrystalline amorphous silicon can be deposited by enhanced plasma chemical vapor deposition (EP CVD), also referred to as plasma enhanced chemical vapor deposition (PE CVD). For dual junction (tandem) p-i-n/p-i-n solar cells, an amorphous silicon germanium semiconductor can be deposited by PECVD to form the i-layer of the bottom p-i-n junction, and an amorphous silicon conductor can be deposited by PECVD to form the i-layer of the front junction. A tunnel junction or recombination junction connects the back amorphous silicon germanium p-i-n cell to the front amorphous silicon p-i-n cell.

The multi-junction solar cells can also be fabricated by forming a microcrystalline sandwich with a n-type semiconductor (conductor) comprising a microcrystalline tunnel junction layer between a polycrystalline solar cell and an adjoining n-i-p amorphous silicon-containing solar cell. The amorphous silicon-containing solar cell has a positively doped p-layer, an active instrinic i-layer, and a negatively doped n-layer. A tunnel junction or recombination junction connects the polycrystalline back solar cell to the amorphous silicon-containing solar cell. The tunnel junction can comprise a negatively doped layer from one of the solar cells, a positively doped layer from the other solar cell, and at least one intermediate tunnel junction layer positioned between the polycrystalline and amorphous silicon-containing second solar cells.

The tunnel junction layer can be fabricated by etching and treating one of the doped layers in the tunnel junction to form an etched surface thereon and, thereafter, nucleating from the etched surface to form and grow a microcrystalline tunnel junction layer. As used in this application, the term "nucleating" means the initial growth phase of microcrystalline layers. Etching can comprise enhanced plasma chemical vapor deposition with an etchant (treatment material), such as hydrogen, deuterium, HD, helium, and argon. Preferably, etching comprises hydrogen etching alone by DC or RF enhanced plasma chemical vapor deposition while preventing substantial optical and electrical damage to the doped layers. Desirably, for best results, silane or other feedstock is prevented from being deposited with the etchant.

Nucleation from the etched surface can be provided to accelerate microcrystalline growth. Microcrystalline nucleation can be accomplished by enhanced plasma chemical vapor deposition with a dopant and a feedstock diluted with a diluent. The dopant can be: a negative dopant comprising a n-type dopant, such as phosphine ($PH_3$) or other phosphorous-containing compounds; or a positive dopant comprising a p-type dopant, such as diborane ($B_2H_6$), $BF_3$, or other boron-containing compounds. The feedstock can be: silane ($SiH_4$), disilane ($Si_2H_6$), tetramethyl silane, $Si(CH_3)_4$, $SiF_4$, $SiHF_3$, $SiH_2Cl_2$, $CH_N(SiH_3)_{4-N}$ wherein N is an integer in the range of 0 to 3, a carbon based feedstock, or a germanium based feedstock. The feedstock can also have the general formula $Si_N H_{2N+2-M} Y_M$ wherein:

Si=silicon

H=hydrogen or deuterium

Y=a halogen [fluorine (F), chlorine (Cl), bromine (Br), Iodine (I), etc.]

N=positive integer $\geq 1$

M=positive integer; and $2N+2-M \geq 0$.

The diluent can be hydrogen ($H_2$), deuterium ($D_2$), or HD. The dilution ratio of the diluent to the feedstock can range from about 50:1 to about 200:1.

Plasma enhanced chemical vapor deposition (PECVD) can be by: cathodic direct current (DC) glow discharge, anodic DC glow discharge, radio frequency (RF) glow discharge, very high frequency (VHF) glow discharge, alternating current (AC) glow discharge, or microwave glow discharge. Plasma enhanced chemical vapor deposition of microcrystalline layers can be accomplished at a temperature ranging from 80–300° C., at a pressure ranging from 0.5–5 Torr, with a dilution ratio of diluent to the feedstock (deposition gas) ranging from 20:1 to 200:1.

The tunnel junction of the multi-junction solar cell can have an etched surface and at least one microcrystalline tunnel junction layer sandwiched between the doped layer of one solar cell and an opposite doped layer of the other solar cell. The etched surface can be a hydrogen plasma etched surface, such as a n-doped amorphous silicon surface or a p-doped amorphous silicon surface. The microcrystalline tunnel junction layer can be a p-type microcrystalline layer and/or an n-type microcrystalline layer and the microcrystalline layer can be microcrystalline silicon carbon, microcrystalline silicon germanium, or microcrystalline silicon. The microcrystalline layer can have a thickness of 50–120 Å, preferably from 80–100 Å. The tunnel junction can comprise an n-type doped non-crystalline amorphous layer, an n-type microcrystalline tunnel junction layer, and a p-type doped non-crystalline amorphous layer. Tunnel junction can also comprise a p-type microcrystalline tunnel junction layer in lieu of or in addition to the n-type microcrystalline tunnel junction layer.

A more detailed explanation of the invention is provided in the following description and appended claims oaken in conjunction with the accompanying drawings.

BRIEF DESCRIPTION OF THE DRAWING

FIG. 5 is a view of the PV modules of this invention mounted on a pitched roof.

DESCRIPTION OF THE PREFERRED EMBODIMENT(S)

Figure 1:
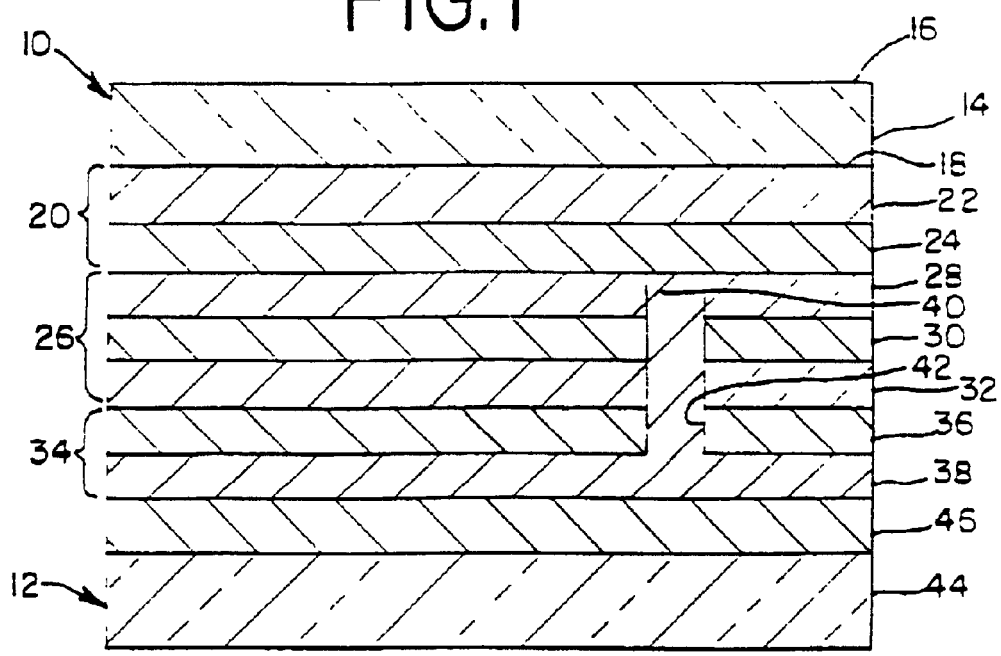
FIG. 1 is a cross-sectional view of an example of a monolithic single-junction solar cell in accordance with principles of the present invention.

The monolithic photovoltaic (PV) module 10 of FIG. 1 provides a photovoltaic device, which comprises a single junction solar cell. The solar cell has a generally planar or flat, light transmissive vitreous substrate 14 made of opaque glass, translucent glass, or most preferably, transparent glass, which provides the front glass of the photovoltaic module. The substrate has an external outer (outside) surface 16 and an inwardly facing inner surface 18. The substrate comprises a sodium-containing glass, such as soda-lime glass.

A dual layer front contact 20 (FIG. 1) can be disposed, deposited, positioned and lies upon the substrate. The dual layer front contact can comprise a dielectric outer front layer 22 comprising silicon dioxide positioned upon and abutting against the inner surface of the substrate and transparent conductive oxide (TCO) inner layer 24 also referred to as a CTO layer or coating, which provides a wide band gap front semiconductor, positioned upon, adjacent and abutting against the dielectric layer. The dielectric layer and the TCO layer can be deposited by low pressure chemical vapor deposition (LP CVD), or other methods. The TCO layer comprises a transparent metallic oxide, such as indium-tin-oxide, zinc oxide, cadmium stannate, or preferably tin oxide having a thickness typically less than 10,000 Å.

An amorphous silicon-containing thin film semiconductor 26 (FIG. 1) provides a single junction solar cell. The amorphous silicon semiconductor solar cell comprises a n-i-p or preferably a p-i-n amorphous silicon thin film semiconductor with a bandgap typically ranging from about 1.4 eV to 1.9 eV, usually to 1.7 eV. The amorphous silicon semiconductor or segment can comprise: hydrogenated amorphous silicon, hydrogenated amorphous silicon carbon or hydrogenated amorphous silicon germanium. The p-layer 28 of the amorphous silicon semiconductor is positioned, disposed and deposited on, covers, lies upon, and is connected to the TCO layer of the front contact. The p-layer can-be doped with diborane ($B_2H_6$), $BF_3$ or other boron-containing compounds. An amorphous silicon, undoped, active intrinsic i-layer 30 is deposited upon, positioned between and connected to the p-layer and an n-type amorphous silicon n-layer 32. The n-layer is positioned on the i-layer and can comprise amorphous silicon carbon or amorphous silicon doped with phosphine ($PH_3$) or some other phosphorous-containing compound.

Amorphous silicon can be doped by adding impurities to the silane. For example, the first dopant may be diborane ($B_2H_6$), which is added to the silane to form a p-type amorphous silicon layer. After the p-type layer has been formed to a thickness on the order of 100 Å, preferably less than 150 Å, and more preferably less than about 80 Å, and most preferably about 60 to about 80 Å or 60 to about 75 Å the diborane flow is stopped to form an intrinsic region having a thickness of at least about 3000 Å, more preferably at least about 3500 Å. Preferably the i-layer has a thickness of about 3000 to about 5500 Å, more preferably about 3500 to about 5000 Å. It can have a thickness of about 4000 to about 5000 Å, or from greater than 4000 Å and, suitably, up to about 5000 or 6000 Å. Thereafter, an n-type dopant, such as phosphine ($PH_3$), is added to the silane flow in order to form an n-type amorphous silicon layer having a thickness of a few hundred Angstroms, preferably less than 150 Å. The p-i interface can optionally be amorphous silicon carbon containing perhaps 5% carbon at the edge of the p-layer. The composition is then linearly graded until it contains no carbon at the i-layer edge. However, there are many ways to make a p-i interface, not all of which involve grading or using carbon.

We have determined that these relatively thin p-layers are more preferable for operation at the high temperatures. We have determined that such thin film p-layers and thick i-layers are preferable for operating the photovoltaic devices of this invention at high temperatures. Preferably, the p-type layer of this invention is an amorphous silicon-carbon layer wherein the layer contains 10–30% carbon and about 0.2 to about 2.0% boron, where the % is atomic percent. Such layers are preferably deposited at about 180° C. to about 220° C., preferably at about 200° C. Also preferred are p-type layers without carbon which are deposited at a lower temperature of about 100 to about 150° C., especially when such layers are made using hydrogen ($H_2$) dilution and more preferably when deposited on a zinc oxide layer. The hydrogen dilution of the source of silicon, such as silane, is typically about 85 to about 95% (volume %) hydrogen.

A dual layer rear contact (back contact) contact 34 (FIG. 1) is deposited and positioned upon and connected to the amorphous silicon n-layer of the solar cell. The inner metallic front layer 36 of the rear contact can comprise a transparent metallic conductive oxide, such as tin oxide, indium-tin-oxide, cadmium stannate, and preferably zinc oxide. The outer metallic rear (back) layer 38 of the rear contact can comprise a metal, such as silver, molybdenum, platinum, steel, iron, niobium, titanium, chromium, bismuth, antimony, or preferably aluminum. The TCO inner layer can be deposited by low pressure chemical vapor deposition (LP CVD), spray coating or other methods. The outer metallic layer can be deposited by sputtering or other methods.

An interconnect 40 (FIG. 1) provides a strong mechanical connection and an electrical contact between the tin oxide inner TCO layer of the front contact and the aluminum outer layer of the rear contact. The interconnect preferably is integral with and comprises the same metal as the outer layer of the rear contact. In the preferred embodiment, the interconnect is aluminum. The interconnect extends through a trench (hole) 42 in the semiconductor and the zinc oxide inner layer of the rear contact. The trench can be formed and scribed simultaneously with a laser through the amorphous silicon containing semiconductor and zinc oxide inner layer of the rear contact. The interconnect preferably fills the trench and connects the tin oxide inner TCO layer of the front contact and the aluminum outer layer of the rear contact.

A transparent vitreous superstrate 44 (FIG. 1) comprising sodium-containing glass, such as soda-line glass, is placed and positioned upon the back (rear) contact of the photovoltaic module and device. The photovoltaic module can be encapsulated with an encapsulating material (encapsulant) 46, such as ethyl vinyl acetate (EVA), to help protect the photovoltaic module from the environment. Other encapsulants can be used with or in place of the EVA, such as: Tedlar type plastic, Nuvasil type plastic, Tefzel type plastic, ultraviolet (UV) curable coatings, etc. and combinations thereof. The photovoltaic module can be unframed or can be partially or fully framed, supported or secured by a metal support comprising a metal member, such as a metal mounting structure, metal struts, or preferably a metal frames.

Figure 2:
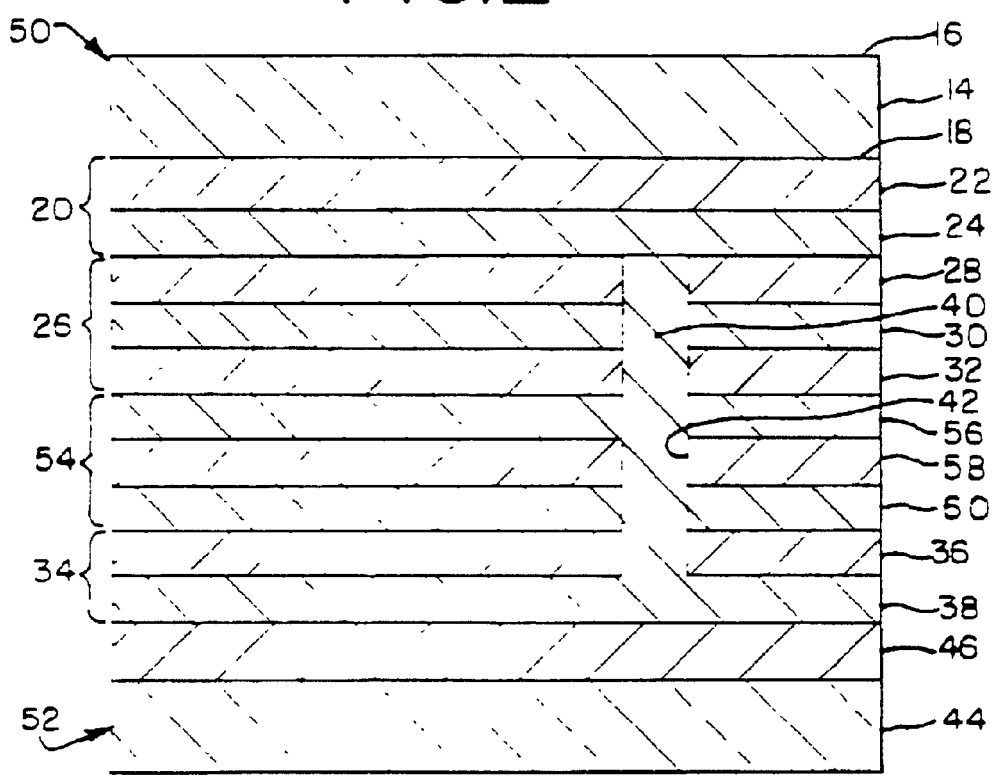
FIG. 2 is a cross-sectional view of an example of a monolithic tandem junction solar cell in accordance with principles of the present invention.

The monolithic module 50 of FIG. 2 provides a photovoltaic device, which comprises a tandem dual (multi) junction solar cell consisting of 26 and 54. The dual junction solar cell of FIG. 2 is generally structurally, physically and functionally similar to the single junction solar cell of FIG. 1, except as explained below. For ease of understanding, similar components and parts of the solar cells of FIGS. 1 and 2 have been given similar part numbers, such as substrate 14, front contact 20 with outer adielectric layer 22 and inner TCO layer 24, amorphous silicon-containing thin film semiconductor 26 which provides front solar cell or segment, dual layer rear contact (back contact) 34 with a TCO inner metallic layer 36 and an outer metallic layer 38, interconnect 40, trench 42, superstrate 44, EVA 46, etc. The p-i-n front solar cell has p-, i- and n-layers, which are arranged as previously explained. The p-, i- and n-layers of the front cell 26 are sometimes referred to as the $p_1$ $i_1$ and $n_1$-layers, respectively, of the front cell. The front cell of the tandem junction solar cell can have a bandgap of 1.4 eV to 1.9 eV and preferably comprises hydrogenated amorphous silicon with a bandgap of 1.7 to 1.8 eV. A rear (back) solar cell 54 comprising an amorphous silicon-containing thin film semiconductor is sandwiched and positioned between and operatively connected to the front cell and the rear (back) contact. The rear amorphous silicon cell can be similar to the front amorphous silicon cell described above. The rear amorphous silicon cell or segment can have a bandgap of about 1.4 eV to 1.75 eV, usually to 1.6 eV and preferably comprises hydrogenated amorphous silicon germanium, preferably with a bandgap of about 1.4 eV. The amorphous silicon positively doped $p_2$-layer 56 of the rear cell is positioned disposed and deposited on, cover, lies and is connected to the amorphous silicon negatively doped $n_1$-layer 32 of the front cell. The amorphous silicon intrinsic $i_2$-layer 58 of the rear cell is deposited upon, sandwiched, positioned between and connected to the $n_2$-layer 60 and $p_2$-layer of the rear cell.

In multi-junction (multiple junction) solar cells, such as the tandem junction solar cells of FIG. 2, the i-layers of the amorphous silicon containing cells can comprise an active hydrogenated compound, such as amorphous silicon, amorphous silicon carbon or amorphous silicon germanium. The active p-layers of the amorphous silicon-containing cells can comprise a p-type hydrogenated compound, such as p-type amorphous silicon, p-type amorphous silicon carbon or p-type amorphous silicon germanium. The active n-layers of the amorphous silicon-containing cells can comprise an n-type hydrogenated compound, such as n-type amorphous silicon, n-type amorphous silicon carbon or n-doped amorphous silicon germanium. The p-type layer is generally formed to a thickness on the order of 100 Å, preferably less than 150 Å, and more preferably about 60 to about 80 Å, and most preferably about 70 to about 80 Å. We have determined that these relatively thin p-layers are more preferable for operation at the high temperatures. At least one of the i-layers suitably has a thickness of at least about 3000 Å, more preferably at least about 3500 Å. Preferably the i-layer has a thickness of about 3000 to about 5500 Å, more preferably about 3500 to about 5000 Å. It can have a thickness of about 4000 to about 5000 Å, or from greater than 4000 Å and, suitably, up to about 5000 or 6000 Å.

Figure 3:
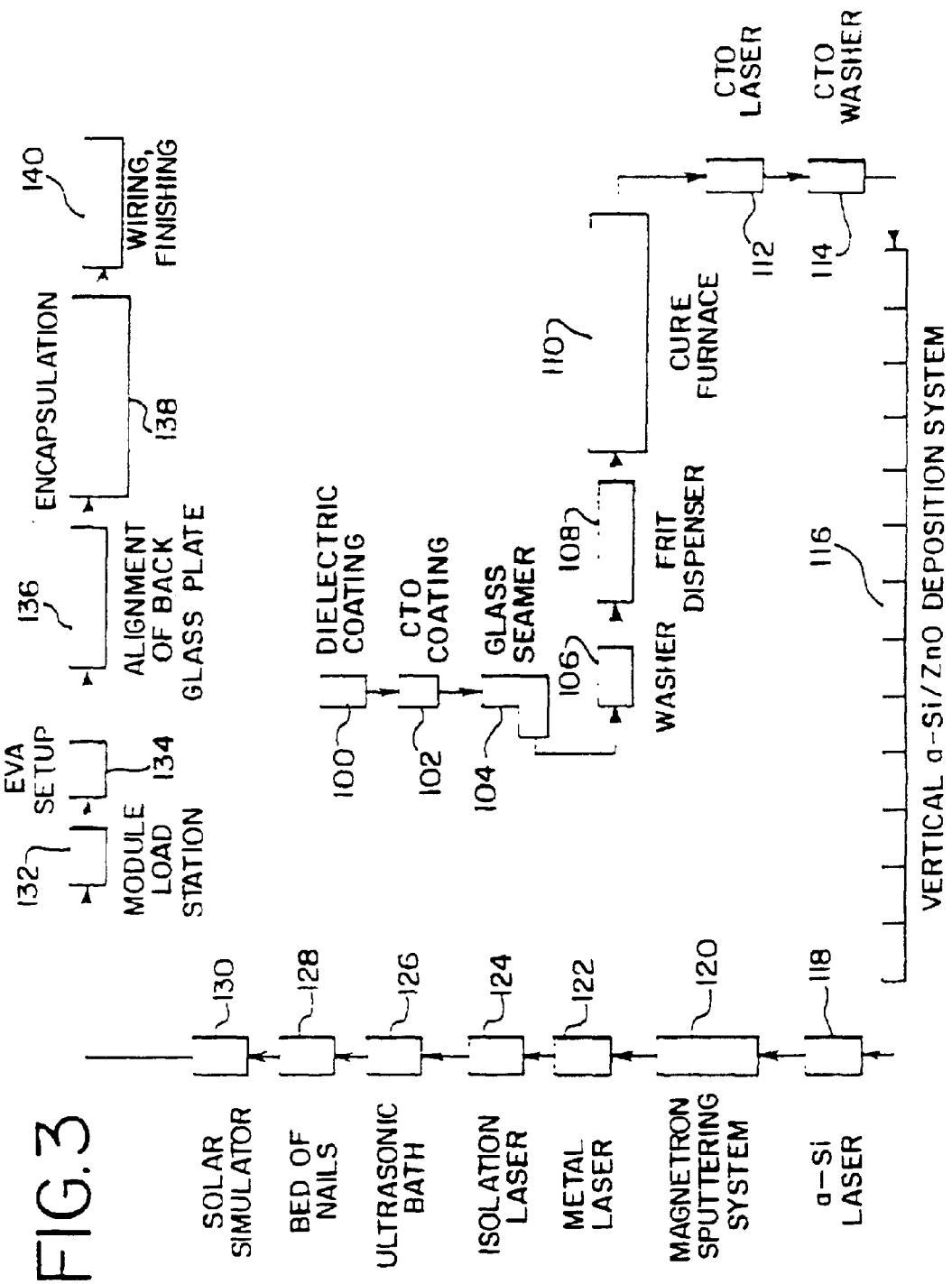
FIG. 3 is a schematic of a process useful for producing photovoltaic devices of this invention.

A preferred process to produce the solar cells of this invention is shown in the process flow diagram of FIG. 3. The inner surface of the glass substrate (front glass) can be coated with a dielectric layer at a dielectric coating station 100. The optional dielectric layer can be deposited on the glass substrate by spraying (spray coating), low pressure chemical vapor deposition (LP CVD) or other methods. The glass substrate can be coated with an inner layer of transparent metallic conductive oxide (CTO or TCO), preferably tin oxide, at a glass CTO coating station 102. The tin oxide can be deposited on the glass substrate by spraying (spray coating) or LP CVD, or other methods. The rough edges of the coated glass substrate are ground to a smooth radius at a glass seamer 104 to reduce chipping and cracking. The glass substrate is then washed and cleaned in a seamed glass washer 106 to remove grinding fluids, particulates, debris, and other contaminants from the glass substrate to assure good adhesion.

A silver fritted conductive paste comprising silver, organic solvents and organic binders is deposited on the glass substrate at a silver frit dispenser 108 (FIG. 3). The glass substrate is then conveyed or otherwise moved to a frit cure (curing) furnace 110 where the glass and silver fritted conductive paste are heated to about 540° C. to evaporate or otherwise remove the organic solvents and burn, sinter or otherwise remove the organic binders. The silver fritted conductive paste is fired to a film in the furnace 110 and is bonded to the glass substrate to provide a means of collecting current and allowing a solderable external connection.

A first pattern (CTO pattern) which provides the cell pattern of the photovoltaic module, is scribed by a laser 112 (FIG. 3). During laser scribing, the laser removes strips, such as 0.001 inch strips, of tin oxide from the tin oxide-coated glass substrate in accordance with a preselected pattern. The strips can extend from about 0.1 inches from each edge of the glass substrate. The laser scribed tin oxide coated substrate is subsequently washed and cleaned in a CTO washer 114 to remove oil, CTO scribe debris, particulates, and waste from the laser scribed substrate.

The laser-scribed substrate is conveyed through a series of deposition chambers 116 (FIG. 3) where the amorphous silicon-containing thin film semiconductors are sequentially deposited on the glass substrate in a n-i-p or p-i-n configuration by plasma-enhanced chemical vapor deposition (PECVD). The glass substrate can be heated to a temperature such as about 200° C. preceding and during PECVD. In order to produce the tandem junction solar cells of FIG. 2, it is preferred to sequentially deposit n-i-p or p-i-n layers of hydrogenated amorphous silicon germanium for the back junction. Thereafter, a layer of transparent metallic conductive oxide (CTO or TCO), preferably zinc oxide, is deposited on the back (rear) layer of the thin film semiconductor in the downstream portion of the deposition chambers 116 by low pressure chemical vapor deposition (LP CVD) or other methods. The zinc oxide provides the inner layer of the dual layer rear contact. The i-layer or layers are deposited to the thickness described herein, i.e., preferably the i-layer has a thickness of about 3000 to about 5500 Å, more preferably about 3500 to about 5000 Å. It can have a thickness of about 4000 to about 5000 Å, or from greater than 4000 Å and, suitably, up to about 5000 or 6000 Å. The i-layer can be about 5000 Å or greater or about 6000 Å or greater.

The zinc oxide-coated thin film semiconductors are then scribed by an amorphous silicon scribing laser 118 (FIG. 3) in a second pattern of interconnect scribes (second pattern) parallel to the first CTO scribe pattern in order to separate the layers into segments and form (drill) a trench (hole) through the zinc oxide-coated thin film amorphous silicon-containing semiconductors. During this laser interconnect scribing step, all semiconductor material and zinc oxide in the scribe are removed, without damaging the tin oxide coating on the substrate. A metal, preferably aluminum, is sputtered by a magnetic sputtering system 120 or otherwise deposited on the scribed zinc oxide layer to provide a uniform metallic outer layer (rear layer) of the dual layer rear contact. Simultaneously or concurrently therewith, a metal, preferably aluminum, is sputtered by the magnetic sputtering system 120 or by other methods to fill the trench so as to form a series interconnect (interconnection) which mechanically and electrically connects the aluminum outer layer of the rear contact with the tin oxide layer of the front contact.

The aluminum outer layer of the rear contact is scribed by a metal scribing laser 122 (FIG. 3) in a third pattern parallel to the interconnect scribes (second pattern) to isolate the segments from each other so as to complete the series interconnection between segments of the photovoltaic modules. All layers of the photovoltaic modules are then scribed by an isolation laser 124 to form an isolation perimeter, such as a 0.1 inch perimeter, around the periphery of the photovoltaic module. The isolation perimeter contains no electrically conductive material and thereby isolates and insulates the segments from each other, except through the series interconnects.

The shunting paths between segments of the photovoltaic module can be alleviated and removed by generating or imposing a controlled DC current across adjacent segments of the photovoltaic modules in a reverse bias operation in an electrical curing apparatus 128 (FIG. 3), sometimes referred to as a "bed of nails" or shunt curing apparatus. This procedure clears the shunts and burns out or otherwise removes shorting material to reduce parasitic losses. The photovoltaic modules are then measured under standard conditions in a solar simulator 130. The performance of the photovoltaic modules are labeled or otherwise identified by power, voltage, or current and separated into bins.

The vitreous superstrate comprising the back glass can be loaded on conveyors at a module load station 132 (FIG. 3). An encapsulating material, preferably ethyl vinyl acetate (EVA), is dispensed from a roll at an EVA setup station 134 to cover the aluminum outer layer of the rear contact and the photovoltaic module. EVA provides a bonding material to bond the superstrate (back glass) to the photovoltaic module. At the alignment station 136, the back glass (superstrate) is aligned with the EVA sheet and photovoltaic module. The aligned superstrate, EVA and photovoltaic module are then laminated and encapsulated in vacuum laminator 138 in an encapsulation and vacuum lamination process. The encapsulation and back glass provide environmental protection for the photovoltaic modules.

In the wiring-and finishing station 140 (FIG. 3), wires are soldered to the frit comprising the metal and frit based conductor film on the substrate (front glass) through holes precut in the superstrate (back glass) to provide access to the solar electrical energy collected by the photovoltaic modules. The solder joints can be potted with epoxy for additional environmental protection. The completed photovoltaic modules are then tested and packaged.

The process for producing single junction solar cells of the type shown in FIG. 1 is similar to the process shown and described in connection with FIG. 3, except only one thin film semiconductor is sequentially deposited in n-i-p or p-i-n layers in the deposition chamber 116.

The process for producing triple junction solar cells can be similar to the process shown and described in connection with FIG. 3 except that three semiconductors are sequentially deposited as hereinafter described in the deposition chamber 116.

In some circumstances, it may be desirable that one or more of the cells be formed in separate deposition chambers or other apparatus, e.g. where crystalline cells are used.

In order to obtain better utilization of the solar spectrum and to improve stability, two or more p-i-n or n-i-p junctions with i-layer materials of different bandgaps can be built in series to form a monolithic multi-junction solar cell. The interface between the two amorphous silicon junctions, often called the tunnel junction or recombination junction, can also be a microcrystalline tunnel junction.

The most significant measure of solar cell performance is its conversion efficiency. The conversion efficiency is the percentage of the energy of the light impinging on the cell converted to electrical energy, which can be used by an external load, e.g. light bulb.

The energy in sunlight (striking a flat surface at solar noon) is about 100 mW/cm$^2$. For convenience solar simulators are calibrated so that the energy that they radiate is as close as possible to 100 mW/cm$^2$. Therefore, the procedure is to measure how much energy is being produced by the cell when illuminated.

The solar cell efficiency is determined by the maximum amount of power it can produce, which is the power at the maximum power point. While conversion efficiency can be defined as the ratio of energy produced to energy incident, it can also be defined in terms of power. The conversion efficiency of a solar cell can be determined as follows:

$$\text{Efficiency}(\%) = (P_{max} / P_{incident}) \times 100$$
$$= (P_{max} / 100) \times 100$$
$$= P_{max}$$

$$\text{Efficiency}(\%) = P_{max} = V_{max} \times J_{max}$$
$$= V_{OC} \times J_{SC} \times FF$$

$V_{oc}$=Open circuit voltage, i.e. the voltage developed by cell in situation where no current is drawn (cell is open circuited). The voltage across the terminals of a car battery measured with a voltmeter, is open circuit voltage (a little over 12V).

$J_{sc}$=Short circuit current, i.e. the current passed by cell if it is short-circuited. If a short heavy wire is placed across the terminals of a car battery the short circuit current (hundreds of amps) will pass through the wire. Short circuit currents on solar cells are much smaller and not nearly as dangerous.

FF=ratio of $P_{max}$ to $V_{oc} \times J_{sc}$.

Efficiency is really given by: Efficiency=$(P_{max}/P_{incident}) \times 100$. However, in practice $P_{incident}$ (power of light incident on cell) is set to 100 so that efficiency=$P_{max}$. Fill factor (FF) is a number used to express efficiency in terms of open circuit voltage ($V_{oc}$) and short circuit current ($J_{sc}$).

While silane and hydrogen are the preferred feedstocks for amorphous silicon cells, there are many alternative feedstocks for undoped plasma-enhanced chemical vapor deposition (CVD) glow discharge a-Si:H and a-SiC:H alloys. The diluent hydrogen (H$_2$) can be replaced by deuterium (D$_2$), with the diluent gas being HD or D$_2$. The alternative feedstocks for silane (SiH$_4$), in addition to SiH$_4$ or instead of SiH$_4$, can be expressed by the following general formula: Si$_N$H$_{2N+2-M}$Y$_M$, where Si is silicon, H is hydrogen or deuterium, Y is a halogen, e.g. fluorine (F), chlorine (Cl), etc., N and M are positive integers under the constraint that N$\geq$1 and 2N+2-M$\geq$0. The examples of the above expression include silane (SiH$_4$), N=1, M=0, disilane (Si$_2$H$_6$), N=2, M=0, SiF$_4$(N=1, M=4, Y=fluorine), SiHF$_3$ (N=1, M=3, Y=fluorine), Si$_2$H$_2$Cl$_4$(N=2, M=4, Y=chlorine), etc.

For hydrogenated amorphous silicon carbon (a-SiC:H) deposition, the possible alternative carbon feedstocks are numerous. In general, most typical hydrocarbons or hydrogen-halogen-carbon compounds can be used, e.g. CH$_4$, C$_2$H$_2$, C$_2$H$_4$, C$_2$H$_6$, CF$_4$, C$_3$H$_8$, CDCl$_3$. Other carbon feedstocks can be used which contain built-in carbon-silicon bonds, which can be expressed by the formula: CH$_N$(SiH$_3$)$_{4-N}$, where N is an integer in the range of 0 to 4, e.g. CH$_3$SiH$_3$ (methylsilane or silylmethane), CH$_3$(SiH)$_3$ (trisilymethane). The H in the second compound (SiH$_3$) in the above formula can be replaced by a halogen, e.g. CH(SiF$_3$)$_3$. When an alternative carbon feedstock is used in addition to or in place of methane (CH$_4$), the deposition parameters such as H$_2$-dilution ratio and power density can be adjusted accordingly. In the process, deposition conditions of high pressure, low temperature and high diluent concentrations are used to attain stable solar cells with high open circuit voltages ($V_{oc}$) and high fill factors (FF).

The photovoltaic devices of this invention can be mounted, for example on a roof or other outside surface of a house, building or other structure for exposure to the sun.

Any suitable mounting system can be used such as, for example, the mounting system described in U.S. Pat. No. 6,111,189, which is incorporated by reference herein. As described herein, the photovoltaic devices and solar modules of this invention are particularly well suited for operation at elevated temperatures. Thus, the photovoltaic devices of this invention can be mounted on a building or other structure directly on the roof or other outside surface of the building or other structure, and spaced only slightly from such surface. Such spacing can be, for example, about 3 inches or less, 2 inches or less or even about 1 or about 0.5 inch or less from the surface. The photovoltaic devices of this invention can be positioned where the bottom surface of the photovoltaic device is in direct contact with the surface of the structure. While the photovoltaic device is generally positioned such that it is parallel to a surface of a structure it is mounted to, it can be pitched or tipped as well. Additionally, due the efficient operation at higher temperatures, it is not necessary to have rapid movement of air between the photovoltaic device and the surface of the structure it is mounted to. Such movement of air will have the effect of removing heat from the photovoltaic device and thereby maintain it at a lower temperature. However, because the photovoltaic devices of this invention operate efficiently at high temperature as described hereinabove, the photovoltaic devices of this invention can be mounted on a building or other structure where there is a minor or no transfer or movement of air in the space between the bottom surface of the photovoltaic device and the surface of the structure. Such reduction in the movement of air can be the result of placing the photovoltaic device within close proximity to the surface of the structure as described above, or it can result from mounting the photovoltaic device in a manner that prohibits the movement of air in the region between the lower surface of the photovoltaic device and the surface it is mounted on, such as where the mounting device is a frame around the photovoltaic device that separates the device from the surface it is mounted on but where the sides of the frame prevent the free movement of air in the space between the bottom surface of the photovoltaic device and the surface it is mounted on. The photovoltaic devices of this can operate to generate electricity from sunlight where the horizontal movement of air under the photovoltaic device, i.e., in the space between the lower surface of the photovoltaic device and the surface it is mounted on and in a direction parallel to the surface of the structure, is for example no more than about 5 ft/sec, or no more than about 1 ft/sec, or 0.2 or 0.05 ft/sec. The temperature of the photovoltaic device under these air flow conditions can be at least about 50° C., preferably at least about 60° C., more preferably at least about 70° C., and may be up to about 80° C., 90° C., or 100° C. or higher.

FIG. 5 shows a pitched roof 1 of building 2 having an array 3 of 16 photovoltaic modules 4 mounted in mounting frame 5. As shown in FIG. 5, such modules are mounted close to the surface of roof 1. Although not shown in the figure, the bottom surface of such modules can be in contact with the roof surface or spaced from such roof surface by, for example, about 3 inches or less, 2 inches or less or even about 1 or about 0.5 inch or less. The frame 5 shown in the figure can also be such that it comes in contact with the roof surface thereby forming a barrier around the outer perimeter of the array of modules thereby prohibiting the free flow of air in the space between the lower surface of the modules and the surface of the roof if the frame mounting system is such that it provides for such a space.

EXAMPLES

All the solar cells examined in these examples were fabricated on commercial tin oxide coated glass. The devices were single-junction cells (glass/$SnO_2$/p-i-n/ZnO/Al). Unless otherwise noted, all light soakings were done at ~40° C. under high-pressure sodium vapor lamps at intensities that produced short-circuit currents close to those produced under 1 sun illumination. The temperature of cells was measured using a thin foil (0.013 mm) thermocouple that was attached to the back contact with a high thermal conductivity paste.

The effect of changing i-layer thickness on the temperature dependence of single-junction cells was examined.

Figure 4:
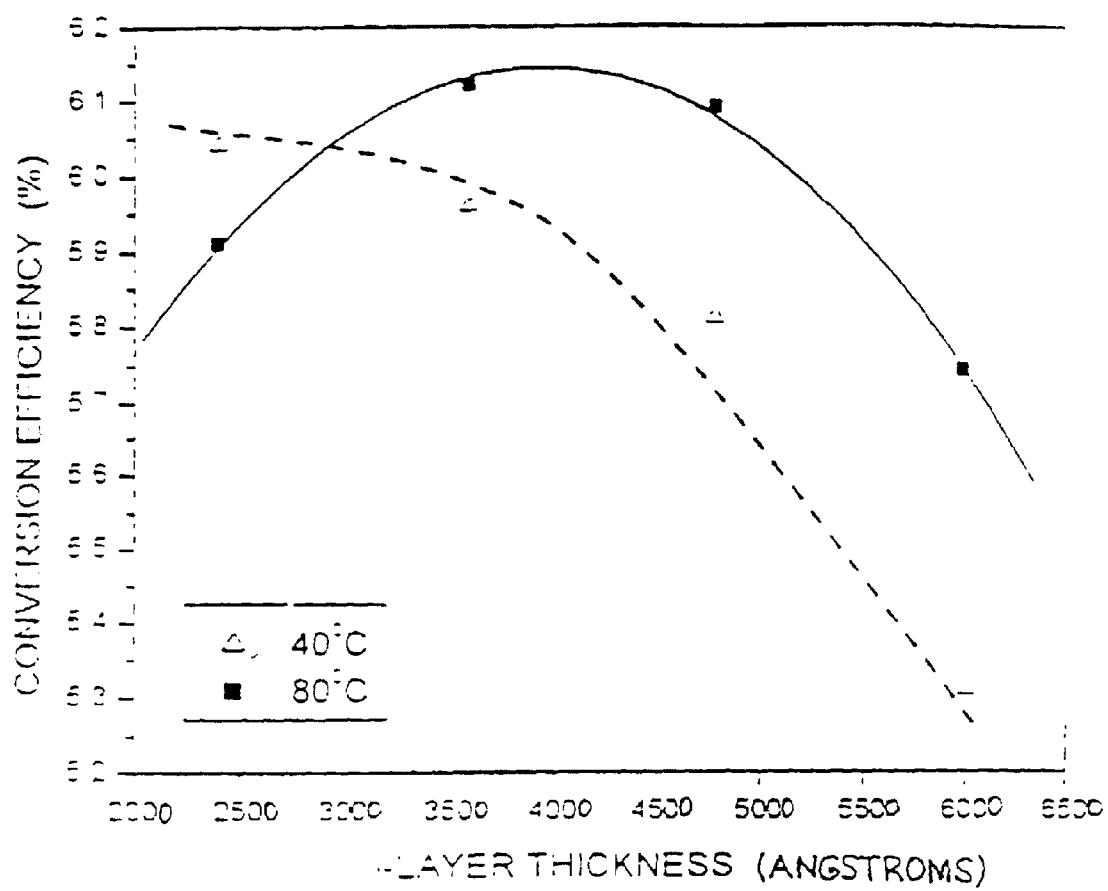
FIG. 4 is a graph of % conversion efficiency vs. i-layer thickness.

A selection of single-junction cells were light soaked (652 hours at ~1 sun) at 40° C. and others at approximately 80° C. As shown in FIG. 4 the stabilized efficiencies at the operating temperatures depends on the thickness of the i-layer. (The efficiencies were measured at the light-soak temperatures.) For cells operating at 40° C., the optimum stabilized efficiency was at a thickness less than 2400 Å while the optimum thickness for cells operating at 80° C. was about 4000 Å. These data show the surprising result that amorphous silicon photovoltaic devices having thicker i-layers are more efficient at higher operating temperatures than corresponding photovoltaic devices having thinner i-layers.

A photovoltaic device comprising amorphous silicon containing i-layer can be tested for optimized high temperature performance by light soaking the device at a low or moderate temperature (for example 40° C.) for a few hundred hours, e.g., for 100–600 hours, until the device has attained a steady state performance, and then measuring the output power or conversion efficiency at that temperature. The same device is light soaked at an elevated temperature (for example 80° C.) for a few hundred hours until the device has attained a steady state temperature, and then measuring the output power or conversion efficiency at that temperature and comparing the obtained values. In addition to that which has been described, this invention is a photovoltaic device comprising amorphous silicon-containing i-layers, which exhibit greater outpower or conversion efficiency after light soaking at an elevated temperature, e.g. 80° C. compared to lower temperatures, e.g., 40° C. The light soaking is suitably done with a high-pressure sodium vapor lamp at intentsities that produce short-circuit currents approximating those produced under 1 sun illumination. Preferably, the photovoltaic devices of this invention comprising amorphous silicon-containing i-layers, i.e., i-layers comprising silicon, exhibit under the above described test conditions, an increase in conversion efficiency and output power at the higher testing temperature compared to the lower testing temperature. Suitably, this increase is at least about 1%, preferably at least about 2% and more preferably at least about 4% and most preferably at least about 5% or 6% conversion efficiency or output power. [Increase in conversion efficiency here is calculated by: $[(CE_{T2}-CE_{T1})/CE_{T1}]\times 100$ where CE is the conversion efficiency at the specified lower temperature (T1) or higher temperature (T2).

Although embodiments of this invention have been shown and described, it is to be understood that various modifications and substitutions, as well as rearrangements of parts, components, and process steps, can be made by those skilled in the art without departing from the novel spirit and scope of this invention.

The provisional patent application No. 60/234,094 filed on Sep. 20, 2000, including the five page paper filed therewith is incorporated by reference herein in its entirety.

U.S. Pat. Nos. 4,064,521; 4,292,092; 4,783;421; 5,593, 901; 6,077,722; 6,121,541 and U.K. Patent Application No.

9916531.8 disclose a process for manufacturing photovoltaic devices. The specifications of these patents and the patent application are hereby incorporated by reference in their entirety.

What is claimed is:

1. A photovoltaic device comprising, an amorphous silicon-containing i-layer having a thickness of about 3000 Å to about 5500 Å, a p-layer having a thickness of no more than about 80 Å, the p-layer comprising amorphous silicon-carbon and containing about 10 to about 30 atomic percent carbon and about 0.2 to about 2.0 atomic percent boron and deposited at a temperature of about 180° C. to about 220° C, and where the device is more efficient at 80° C. than at 40° C.

2. The photovoltaic device of claim 1 wherein the i-layer is at least about 3500 Å thick.

3. The photovoltaic device of claim 1 in the form of module and wherein the module is on a roof surface such that a bottom surface of the module is no more than about 1 inch from the roof surface.

4. The photovoltaic device of claim 1 wherein the layer is at least about 5000 Å.

5. A process for generating electric current comprising exposing a photovoltaic device comprising a p-layer and an amorphous silicon-containing i-layer to sunlight wherein the photovoltaic device is at a temperature of at least about 50° C., the amorphous silicon-containing i-layer has a thickness of about 3000 Å to about 5500 Å, the p-layer has a thickness of no more than about 80 Å the p-layer comprising amorphous silicon-carbon and containing about 10 to about 30 atomic percent carbon and about 0.2 to about 2.0 atomic percent boron and deposited at a temperature of about 180° C. to about 220° C., or and wherein than at 80° C. than at 40° C.

6. The process of claim 5 wherein the temperature is about 50° C. to about 100° C.

7. The process of claim 6 wherein the photovoltaic devices is at a temperature of about 60° C. to about 90° C.

8. The process of claim 5 wherein the photovoltaic device is in the form of a module and wherein the module is positioned on a roof surface such-that a bottom surface of the module is no more than about 1 inch from the roof surface.

9. A process for generating electric current comprising exposing a photovoltaic device comprising a p-layer and an amorphous silicon-containing i-layer to sunlight wherein the photovoltaic device is at a temperature of at least about 50° C. the amorphous silicon-containing i-layer has a thickness of about 3000 Å to about 550 Å, the p-layer has a thickness of no more than about 100 Å, the p-layer comprising amorphous silicon-carbon and containing about 10 to about 30 atomic percent carbon and about 0.2 to about 2.0 atomic percent boron and deposited at a temperature of about 180° C. to about 220° C. the device is more efficient at 80° C. at 40° C., the photovoltaic device is in the form of a module and the module is positioned on a roof outer surface such that a bottom surface of the module is no more than about 3 inches from the roof outer surface and wherein air is located in a space between the module and the roof outer surface and horizontal movement of air in the space between the bottom surface and the roof motor surface is no more than about 1 ft/sec.

10. A system comprising a building surface, a photovoltaic device in the form of a module, wherein the photovoltaic device comprises an amorphous silicon-containing i-layer having thickness of about 3000 Å to about 5500 Å, a p-layer having a thickness of no more than about 100 Å, the p-layer comprising amorphous silicon-carbon and containing about 10 to about 30 atomic percent carbon and about 0.2 to about 2.0 atomic percent boron and deposited at a temperature of about 180° C. to about 220° C., and, wherein a bottom surface of the module is spaced from the building outer surface by a distance of no more than about 1 inch, and wherein the device is more efficient at 80° C. than at 40° C.

11. The system of claim 10 wherein the module is operated at a temperature of at least about 50° C.

12. The system of claim 10 wherein the i-layer has a thickness of at east about 4000 Å.

13. The system of claim 10 wherein the p-layer has a thickness of no more than about 80 Å.

14. The system of claim 10 wherein the distance is no more than about 0.5 inches.

* * * * *